United States Patent
Narita (10) Patent No.: US 8,031,244 B2
(45) Date of Patent: Oct. 4, 2011

(54) DEVICE FOR RELEASING HEAT GENERATED IN THE AMPLIFIER UNIT OF A SOLID-STATE IMAGE SENSING ELEMENT

(75) Inventor: Hirochika Narita, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 741 days.

(21) Appl. No.: 11/970,546

(22) Filed: Jan. 8, 2008

(65) Prior Publication Data

US 2008/0174684 A1 Jul. 24, 2008

(30) Foreign Application Priority Data

Jan. 23, 2007 (JP) ................................. 2007-012638

(51) Int. Cl.
*H04N 5/225* (2006.01)

(52) U.S. Cl. ........................................ 348/294; 348/340

(58) Field of Classification Search ...... 348/207.99–376
See application file for complete search history.

(56) References Cited

U.S. PATENT DOCUMENTS

| | | | | |
|---|---|---|---|---|
| 6,426,591 | B1 * | 7/2002 | Yanagisawa et al. | 313/512 |
| 6,791,076 | B2 * | 9/2004 | Webster | 250/239 |
| 6,963,437 | B2 * | 11/2005 | Bauer et al. | 359/245 |
| 7,061,697 | B2 * | 6/2006 | Magni et al. | 359/811 |
| 7,425,747 | B2 * | 9/2008 | Watanabe et al. | 257/379 |
| 7,429,494 | B2 * | 9/2008 | Oliver et al. | 438/26 |
| 7,452,750 | B2 | 11/2008 | Lo et al. | |
| 2002/0002038 | A1 * | 1/2002 | Seawright et al. | 455/127 |
| 2002/0004251 | A1 | 1/2002 | Roberts et al. | |
| 2002/0044211 | A1 * | 4/2002 | Tujii et al. | 348/302 |
| 2003/0020174 | A1 * | 1/2003 | Kohno | 257/774 |
| 2005/0030399 | A1 * | 2/2005 | Suzuki et al. | 348/294 |
| 2005/0040522 | A1 * | 2/2005 | Takehara et al. | 257/723 |
| 2006/0018646 | A1 * | 1/2006 | Stavely | 396/55 |

FOREIGN PATENT DOCUMENTS

| | | |
|---|---|---|
| CN | 101030546 | 9/2007 |
| JP | 6-163950 | 6/1994 |
| JP | 7-86542 | 3/1995 |
| JP | 7-161954 | 6/1995 |
| JP | 07-283349 | 10/1995 |
| JP | 11-330285 | 11/1999 |
| JP | 2000-228475 | 8/2000 |
| JP | 2001-68578 | 3/2001 |
| JP | 2005-101484 | * 4/2005 |

OTHER PUBLICATIONS

Chinese Patent Office issued a Chinese Office Action dated Jun. 19, 2009, Application No. 200810008531.X.
Chinese Official Action—200810008531.X—Jun. 2, 2011.

* cited by examiner

*Primary Examiner* — Tuan Ho
*Assistant Examiner* — Kent Wang
(74) *Attorney, Agent, or Firm* — Young & Thompson (57) ABSTRACT

A solid-state imaging device with an improved heat releaseability for releasing a heat generated in the amplifier unit of the solid-state image sensing element includes an elongated substrate (molded case 18), a metallic layer 16 exposed in a surface of the molded case 18 and extending along an elongating direction of the molded case 18, and an elongated solid-state image sensing element 20 mounted on the metallic layer 16, in which a thickness in a region of a metallic layer 16 right under an amplifier unit of the solid-state image sensing element 20 is larger than thicknesses in other regions of the metallic layer 16.

9 Claims, 8 Drawing Sheets

| | | THERMAL RESISTANCE OF SOLID-STATE IMAGING DEVICE 10 (°C/W) | | | | | |
|---|---|---|---|---|---|---|---|
| | | 20 | 25 | 30 | 35 | 40 | 50 |
| THICKNESS OF SECOND METALLIC LAYER 14(mm) | 4W/mk * | 1.6 | 1.4 | 1.2 | 1.0 | 0.8 | 0.3 |
| | 2W/mk * | 1.8 | 1.6 | 1.3 | 1.1 | 0.9 | 0.4 |
| | 1.2W/mk * | 1.9 | 1.7 | 1.5 | 1.3 | 1.0 | 0.6 |

* : THERMAL CONDUCTIVITY OF MOUNT MATERIAL

DEVICE FOR RELEASING HEAT GENERATED IN THE AMPLIFIER UNIT OF A SOLID-STATE IMAGE SENSING ELEMENT

This application is based on Japanese patent application No. 2007-012,638, the content of which is incorporated hereinto by reference.

BACKGROUND

1. Technical Field

The present invention relates to a solid-state imaging device including a solid-state image sensing element having a plurality of photo-transistors that are formed to be linearly arranged.

2. Related Art

Figure 7:
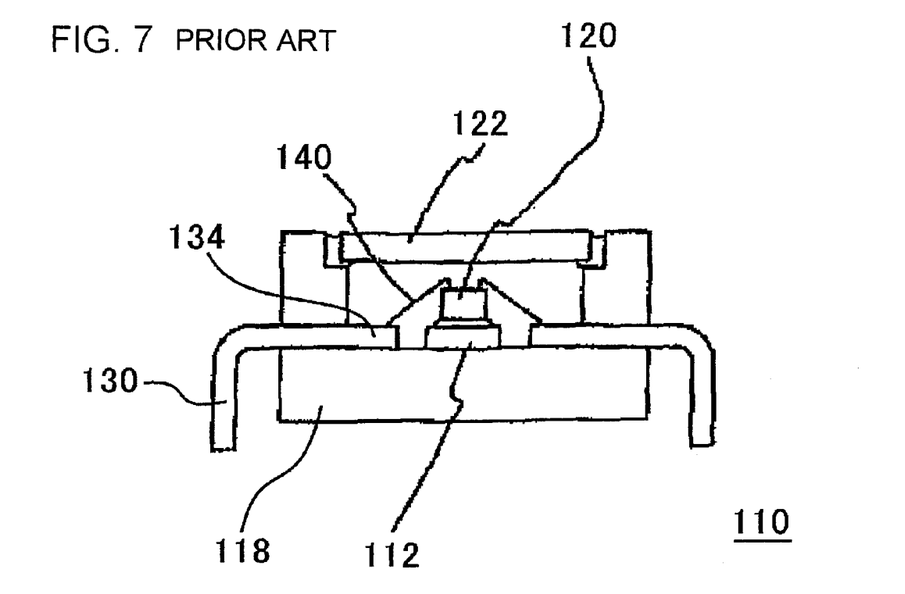
FIG. 7 is a cross-sectional view of a conventional solid-state imaging device along a width direction.

A typical example of a conventional solid-state imaging device is described in Japanese Patent Laid-Open No. H6-163,950 (1994). FIG. 7 shows a cross-sectional view along a width direction of a solid-state imaging device described in Japanese Patent Laid-Open No. H6-163,950.

A solid-state imaging device 110 includes an elongated solid-state image sensing element 120 in substantially central portion in a molded case 118, which includes a metallic layer 112 called an "island". The solid-state image sensing element 120 is mounted on the metallic layer 112. The surface of the solid-state image sensing element 120 is provided with a bonding pad, which is not shown here. A surface of an inner lead 134 is exposed within the molded case 118. The bonding pad is electrically coupled to inner lead 134 through bonding wires 140. Further, the inner lead 134 extends through and beyond the molded case 118 to be coupled to an outer lead 130 outside of the molded case 118. An upper opening of the molded case 118 is encapsulated by a transparent plate 122.

Such type of structure is also described in Japanese Patent Laid-Open No. H7-86,542 (1995), Japanese Patent Laid-Open No. H7-161,954 (1995), Japanese Patent Laid-Open No. H11-330,285 (1997) and Japanese Patent Laid-Open No. 2001-68,578.

Figure 8:
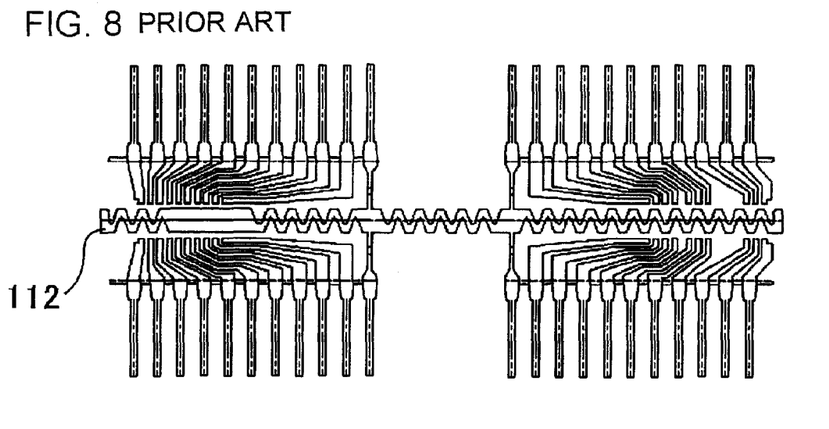
FIG. 8 is a schematic plan view of a lead frame employed for manufacturing a solid-state imaging device disclosed in a related prior document.

Further, Japanese Patent Laid-Open No. 2000-228,475 describes, as shown in FIG. 8, a solid-state imaging device employing a lead frame having a metallic layer 112 of larger dimension in a region right under an amplifier unit of a solid-state image sensing element. It is described that a heat from the amplifier unit of the solid-state image sensing element can be quickly released according to such configuration.

However, the conventional technologies as described above face problems to be solved in the process of releasing heat that has been generated in the amplifier unit of the solid-state image sensing element.

In recent years, a downsizing of a solid-state imaging device is required, and developments for achieving more dense arrangement of pixels and a miniaturization of solid-state image sensing elements are proceeded. Such developments causes an increased amount of heat generated in the amplifier unit of the solid-state image sensing element, leading to an elevated temperature of the solid-state image sensing element and uneven temperature distribution of the pixels. This adversely affects a quality of an image read by the solid-state imaging device, causing a considerable deterioration in the reliability of the solid-state imaging device. Therefore, there is a need in the industry for reducing the temperature of the solid-state image sensing element during the operation by releasing heat from the amplifier unit of the solid-state image sensing element with an improved efficiency to provide an uniform temperature distribution of pixel, thereby achieving a stabilized imaging function of the solid-state image sensing element.

More specifically, the present invention is directed to providing a solution to new and novel issue that is arisen due to a downsizing of solid-state imaging devices, and the issue is solved by achieving an improved efficiency in releasing a heat generated in the amplifier unit of the solid-state image sensing element.

SUMMARY

In one embodiment, there is provided a solid-state imaging device, comprising: an elongated substrate; a metallic layer exposed to a surface of the substrate and extending in an elongating direction of the substrate; and an elongated solid-state image sensing element mounted over the metallic layer, wherein a thickness in a region of the metallic layer right under an amplifier unit of the solid-state image sensing element is larger than thicknesses in other regions of the metallic layer.

Since the metallic layer is formed to be thicker in the region of the solid-state image sensing element right under the amplifier unit according to the present invention, a heat generated in the amplifier unit can be released with an improved efficiency. This allows providing uniform temperature distribution of pixels, thereby achieving a stabilized imaging function of the solid-state imaging device.

According to the present invention, an improved heat release-ability for releasing a heat generated in the amplifier unit of the solid-state image sensing element is provided, so that the solid-state imaging device, which is capable of providing an improved imaging function, can be provided.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Exemplary implementations according to the present invention will be described in reference to the annexed figures. In all figures, an identical numeral is assigned to an element commonly appeared in the figures, and the detailed description thereof will not be repeated.

First Embodiment

Figure 1:
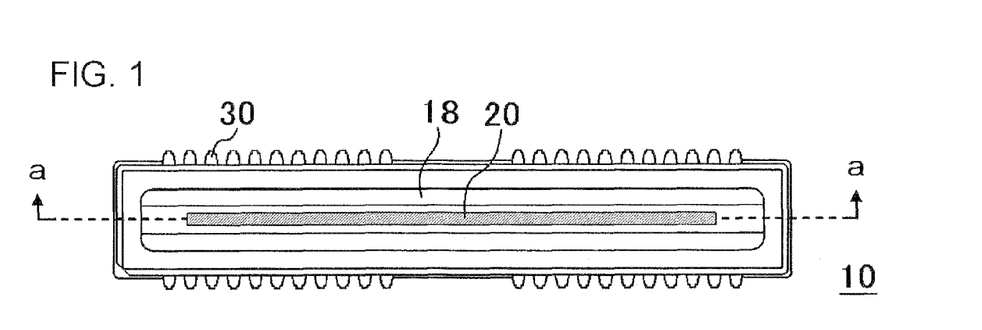
FIG. 1 is a schematic plan view of a solid-state imaging device of an embodiment according to the present invention.
Figure 2:
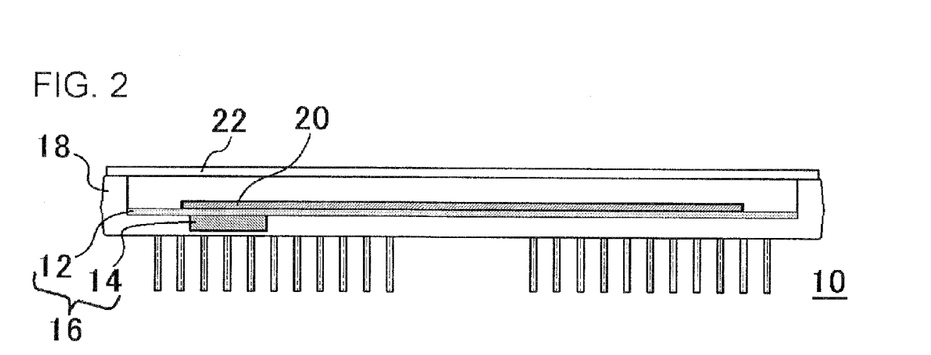
FIG. 2 is a cross-sectional view of the solid-state imaging device shown with FIG. 1 along line a-a.
Figure 3:
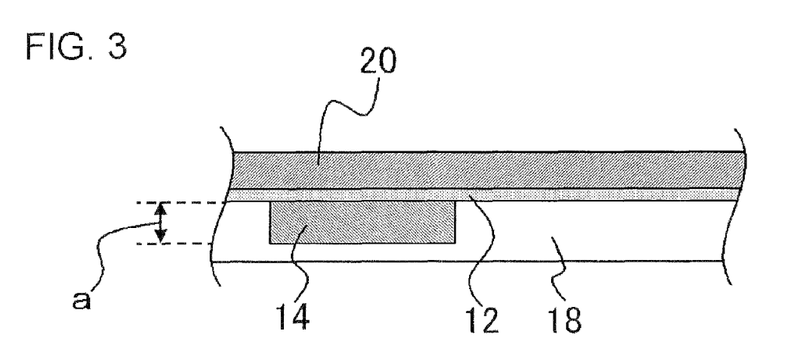
FIG. 3 is an enlarged cross-sectional view of the solid-state imaging device shown in FIG. 2 in first embodiment.

FIG. 1 shows a schematic plan view of a solid-state imaging device 10 of first embodiment, FIG. 2 shows a cross-sectional view of the solid-state imaging device 10 shown in FIG. 1 along line a-a, and FIG. 3 shows a partially-enlarged cross section view, illustrating the solid-state imaging device 10 shown in FIG. 2.

The solid-state imaging device 10 includes an elongated substrate (molded case 18), a metallic layer 16 exposed in a surface of the molded case 18 and extending along an elongating direction of the molded case 18, and an elongated solid-state image sensing element 20 mounted over the metallic layer 16. The solid-state imaging device 10 has a long and narrow geometry, having, for example, a length of about 55 mm, a width of about 10 mm and a thickness of about 8 mm.

The molded case 18 has a form of a box which opens in the upper ends to form an upper opening, and such upper opening is closed with a transparent plate 22 such as a glass plate, thereby forming a hollow package form. A surface of the elongated metallic layer 16 is exposed in a substantially central portion of the upper surface in the interior of the molded case 18, and the solid-state image sensing element 20 is mounted over the surface of the metallic layer 16.

The metallic layer 16 is composed of a first metallic layer 12 and a second metallic layer 14 as shown in FIG. 2, and it is designed that the first metallic layer 12 is exposed within the molded case 18. As shown in FIGS. 2 and 3, the second metallic layer 14 is adhered to a back surface of the first metallic layer 12 in a region right under an amplifier unit of the solid-state image sensing element 20, and a thickness of the metallic layer 16 in the region right under the amplifier unit is larger than thicknesses of other regions of the metallic layer 16.

The first metallic layer 12 contains copper as a major constituent, and further contains an alloy containing iron, phosphorus, tin or the like, and a layer thickness thereof is about 0.25 mm.

The second metallic layer 14 contains one or more metal(s) selected from a group consisting of copper, aluminum and an alloy thereof. In the present embodiment, oxygen-free copper may be employed as copper. Oxygen free copper has better thermal conductivity, and thus is preferably employed. A thickness "a" of the second metallic layer 14 is about 1.5 mm.

Typical solid-state image sensing element 20 employed here is a one-dimensional charge-coupled device (CCD), which includes an input electrode in one end and also includes an amplifier unit and an output electrode in another end, and also includes several-thousand pixels arranged between both ends to form a straight line pattern. A heat generated from the solid-state image sensing element 20 concentrates on the amplifier unit. A solid-state image sensing element that exhibits a power consumption of 0.4 W to 2 W may be employed as the solid-state image sensing element 20 employed in the present embodiment. Typical solid-state image sensing element 20 may be an elongated device having a dimension of, for example, several tens mm in length, 0.3 to 1.2 mm in width and 0.3 to 0.7 mm in thickness.

A plurality of bonding pads (not shown) are included on the surface of both ends in elongating direction of the solid-state image sensing element 20, and are electrically coupled thereto via a plurality of inner leads (not shown) exposed within the molded case 18 and bonding wires.

Further, the inner leads extend through the molded case 18 and are coupled to outer leads 30 outside of the molded case 18. A lead section is composed of the inner leads and the outer leads 30.

Figure 4:
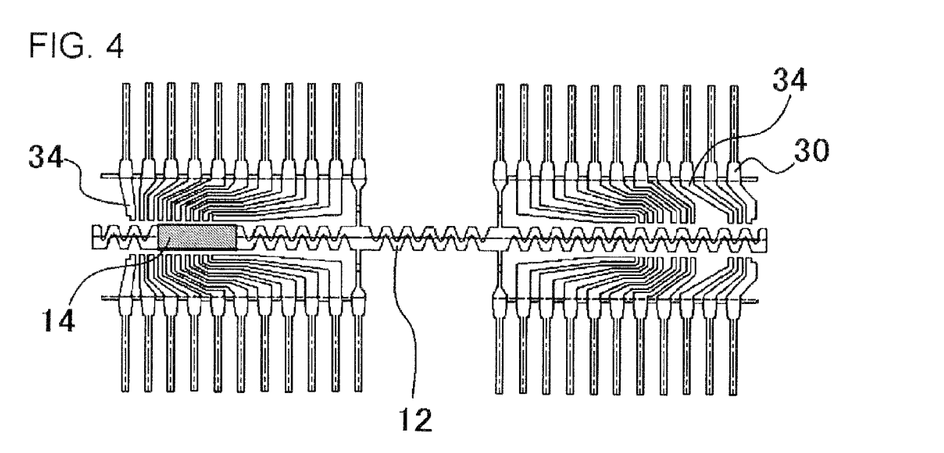
FIG. 4 is a schematic plan view of a lead frame employed for manufacturing a solid-state imaging device according to the present embodiment.

The solid-state imaging device 10 of the present embodiment may be manufactured as follows. First of all, a strip of a metal such as copper alloy and the like is processed into a lead frame having a certain geometry via a stamping process. The lead frame is composed of the first metallic layer 12 referred to as "island", inner leads 34, outer leads 30 and a frame. Subsequently, as shown in FIG. 4, a metallic plate is adhered so as to form a region right under the amplifier unit of the solid-state image sensing element 20 to provide the second metallic layer 14. The metallic plate may be obtained by profiling a strip of a metal such as oxygen free copper and the like via a stamping process.

An adhesive agent may be employed to adhere the metallic plate composed oxygen free copper or the like to the back surface of the first metallic layer 12, or a metallic plate treated by a tin-plating and the back surface of the first metallic layer 12 plated with gold may be adhered to the surface to be adhered via heating and compressing.

Then, the lead frame having the second metallic layer 14 formed therein is stored in a certain metal mold, and then a molding process is conducted with an insulating thermosetting resin or the like to form the molded case 18. The molded case 18 has a form of a box which opens in the upper ends, and the surface of the first metallic layer 12 is exposed in the inner surface thereof, and further, the surfaces of the inner leads 34 are exposed in vicinity of the end portion the first metallic layer 12.

Subsequently, the solid-state image sensing element 20 is adhered to a substantially central portion in the surface of the first metallic layer 12 exposed on the inner surface of the molded case 18 with a thermosetting resin (die bond material) such as an epoxy resin, a silicone resin, a polyimide resin and the like.

Then, the inner leads 34 exposed in the molded case 18 are connected to the bonding pads formed on the surface of the solid-state image sensing element 20 via respective bonding wires.

After the inner leads 34 are connected to the bonding pads via the bonding wires as described above, a transparent plate 22 is pasted to the open upper opening end of the molded case 18 to close the upper opening of the molded case 18. Further, unwanted sections of the lead frame are removed, and then a bending process for sections in the outer lead 30 is conducted to produce the solid-state imaging device 10 of the present embodiment.

The solid-state imaging device 10 of the present embodiment produced as described above may be employed as a line sensor for electronic equipments having an imaging-ability such as a photo copying machine, a scanner and the like.

Advantageous effects obtainable by employing the above-described configuration of the solid-state imaging device 10 of the present embodiment will be described as follows. Since the metallic layer is formed to be thicker in the region right under the amplifier unit of the solid-state image sensing element 20 according to the solid-state imaging device 10 of the present embodiment, a heat generated in the amplifier unit can be released with an improved efficiency. Therefore, an increase in the temperature of the solid-state image sensing element 20 is inhibited, and uniform temperature distribution of pixels is provided, thereby achieving a stabilized imaging function.

Further, the present configuration allows providing benefits such as an inhibition of a warpage of the solid-state imaging device, a reduction in the manufacturing cost, a reduction in the product weight, a simplification of the manufacturing procedure and the like, as compared with the configuration, in which the metallic layer in the region right under the whole solid-state image sensing element extending over the overall length thereof is formed to be thicker.

If the metallic layer is formed to be thicker in the region right under the whole solid-state image sensing element extending over the overall length thereof, a considerable difference in thermal expansion is caused for the metallic layer and the mold resin, leading to possibly cause a warpage in the solid-state imaging device during the manufacture and in operation. On the contrary, the configuration of having locally thicker metallic layer achieves minimized influence of the difference in thermal expansion, so that a warpage of the solid-state imaging device can be prevented, thereby providing an improved production yield and an enhanced resolution of the imaging product.

Further, the metallic layer 16 may be composed of the first metallic layer 12 and the second metallic layer 14, a multiple-layered structure of the first metallic layer 12 and the second metallic layer 14 may be formed in the region right under the amplifier unit of the solid-state image sensing element 20, and a single layer structure composed of the first metallic layer 12 may also be employed in other regions.

Even if a type of metal exhibiting lower strength lower elastic modulus and having higher thermal conduction, which is not suitable for a material of the lead frame, is employed, the above-described configuration allows such type of metal being employed for the second metallic layer 14, such that the solid-state imaging device exhibiting further improved heat release-ability can be presented.

Further, since procedure of adhering the second metallic layer 14 to the back surface of the first metallic layer 12 provides the multiple-layered structure of the metallic layer 16 in the present embodiment, the simple procedure for producing of the device can be achieved, as compared with the case of producing the multiple-layered structure by employing a single-piece molding process of metallic layers. Further, since the metallic composition of the second metallic layer 14 can be selected to be different from that of the first metallic layer 12, an enhanced degree of flexibility in the design of the device can be achieved.

In addition, the thermal resistance of the solid-state imaging device 10 can be selected to be equal to or lower than 35 degree C/W, and the thickness of the second metallic layer 14 can be selected to be equal to or larger than 1 mm.

This allows obtaining the above-described advantageous effects, and further, even if the second metallic layer 14 is provided, an increase in the temperature of the solid-state imaging device 10 due to a heat generated in the solid-state image sensing element can be fallen within an allowable range, thereby further effectively inhibiting a deterioration in the imaging function of the solid-state imaging device.

For example, since the temperature in the electronic equipment employing the solid-state imaging device 10 is generally elevated up to a temperature of around 65 degree C, the solid-state imaging device 10 is required to have a thermal resistance of equal to or lower than 35 degree C/W for the solid-state imaging device 10 of the power consumption of 1 W, so that the upper limit temperature in use of the solid-state imaging device 10 is equal to or lower than 100 degree C. Experiments were conducted for obtaining a relationship of the thermal resistance of the solid-state imaging device 10 with the thickness of the second metallic layer 14 in the following condition. Results of such experiments are shown in table of FIG. 5.

Figure 5:
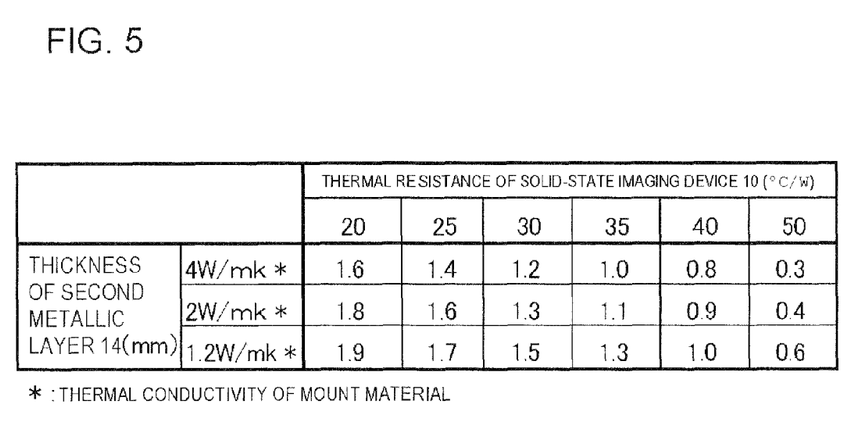
FIG. 5 is a table including experimental results that shows a relationship between a thermal resistance of the solid-state imaging device and a thickness of the second metallic layer.

Length of solid-state imaging device 10: 70 mm, Width: 9 mm;

Material of the first metallic layer 12: copper alloy (K F C: commercially available from Kobe Steel, Ltd.), Thickness: 0.25 mm;

Material of the second metallic layer 14: oxygen free copper, Thermal conductivity: 391 W/mk;

Length of the solid-state image sensing element 20: 49 mm, Width: 0.8 mm, Power consumption: 1 W; and Mount materials (for providing adhesion of the first metallic layer 12 to the solid-state image sensing element 20): three types of materials having thermal conductivities of 4 W/mk, 2 W/mk and 1.2 W/mk were employed.

The results of the experiments indicate that the thermal resistance of the solid-state imaging device 10 can be designed to be equal to or lower than 35 degree C/W regardless of the thermal conductivity of the mount material, by selecting the thickness of the second metallic layer 14 to be equal to or larger than 1 mm. It is confirmed that, having such configuration, an increase in the temperature due to a generation of heat from the solid-state image sensing element 20 can be inhibited, thereby more effectively inhibiting a deterioration in the imaging function. In addition to above, the upper limit of the thickness of the second metallic layer 14 may be sufficient to be within an allowable range in the design of the device, and for example, may be not larger than 2 mm. In addition to above, even if the solid-state imaging device 10 is designed to have higher upper limit temperature in the operation for accommodating the increased temperature in the electronic equipment employing the solid-state imaging device 10, the results as described above can also be obtained.

Second Embodiment

Descriptions of a solid-state imaging device 10 of the second embodiment will be made only on features that are different from the solid-state imaging device 10 of first embodiment in reference to annexed figures, and the similar features will not be repeated.

Figure 6:
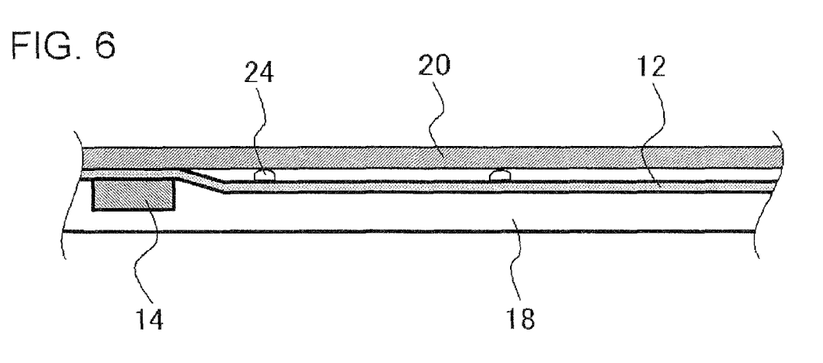
FIG. 6 is an enlarged cross-sectional view of the solid-state imaging device 10 shown in FIG. 2 in second embodiment.

The solid-state imaging device 10 of second embodiment includes two protruding portions 24 on a surface of a first metallic layer 12 in other regions except a region right under the amplifier unit of the solid-state image sensing element 20. The solid-state image sensing element 20 is partially mounted over the first metallic layer 14 in a region right under the amplifier unit, and is also partially mounted over protruding portion 24 in the other regions. This allows maintaining the solid-state image sensing element 20 to be substantially horizontal, thereby providing a stabilized imaging function of the solid-state imaging device 10.

The protruding portions 24 may be formed of a molding resin. Heights of protruding portions 24 from the surface of the first metallic layer 12 is determined in consideration of a cure shrinkage of the employing molding resin.

The solid-state imaging device 10 of the present embodiment may be also manufactured in the similar manner as in first embodiment, except that a molding process for the protruding portions 24. In order to form the protruding portions 24, a metal mold having cavities corresponding to the protruding portions 24 may be employed.

Advantageous effects obtainable by employing the above-described configuration of the solid-state imaging device 10 of second embodiment will be described as follows. When the second metallic layer 14 is provided in the region right under the amplifier unit of the solid-state image sensing element 20 as in first embodiment, levels of thermal shrinkage and cure shrinkage of the resin caused during the molding process are different for locations provided with the second metallic layer 14 and for locations without additional metallic layer. More specifically, the locations provided with the second metallic layer 14 (resin is thin) exhibits smaller shrinkages due to a smaller amount of the resin, and the locations without the second metallic layer 14 (resin is thick) exhibits larger shrinkages due to a larger amount of the resin. Thus, the height of the surface of the first metallic layer 12 may possibly be partially variable. However, such variation in the height is quite small, and thus does not cause a problem in general.

Nevertheless, when further improved accuracy is required for the imaging function of the solid-state imaging device 10, it is preferable to reduce the variation in the height of the surface of the first this metallic layer 12.

The solid-state imaging device 10 of the present embodiment is additionally provided with the protruding portions 24 on the surface of the first metallic layer 12, which function as compensating the difference in the amounts of the thermal shrinkage and the cure shrinkage of the resin. Therefore, even if the solid-state image sensing element 20 is mounted on the surface of the first metallic layer 12, the solid-state image sensing element 20 is maintained to be substantially horizontal, and thus a warpage and/or waviness due to the difference in the height of the surface of the first metallic layer 12 are not generated. Therefore, more stable imaging function of the solid-state imaging device 10 is achieved, thereby allowing an imaging with an improved accuracy.

While the above-described embodiments illustrate the exemplary implementations of the present invention in reference to the annexed figures, various modifications other than that disclosed above may also be available.

While the present embodiment has been described in reference to the exemplary implementation that is provided with the amplifier unit of the solid-state image sensing element 20 in only one side end, the thickness of the metallic layer 16 in the regions right under the amplifier unit of both ends may be larger than the thickness of the metallic layer 16 in other regions in a case of having the amplifier units in both ends.

While the present embodiment has been described in reference to the metallic layer 16 having the multiple-layered structure composed of the first metallic layer 12 and the second metallic layer 14, the metallic layer 16 may alternatively be a single member that is formed by a single-piece molding process of these metallic layers.

The second metallic layer 14 may be composed of a plurality of layers having different metallic compositions. While the solid-state imaging device 10 of second embodiment includes two protruding portions on the surface of the first metallic layer 12, at least one protruding portion or more is sufficient to be included provided that the solid-state image sensing element 20 can be substantially horizontally maintained.

In addition, the present embodiment can be configured that the bottom surface of the metallic layer 16 is present in the same plane as the bottom surface of the molded case 18. This allows the bottom surface of the metallic layer 16 to be in contact with the base substrate, when the solid-state imaging device 10 is mounted, thereby providing an improved heat release-ability.

The height of the metallic layer 16 from the upper surface of the molded case 18 may be designed to be higher than conventional solid-state imaging devices. For example, a height of around 2 mm may be employed. This allows preventing a defective characteristic such as pixel faults can be inhibited, even if the trash is adhered to the surface of the transparent plate 22.

In addition, in the substantially central portion in the elongating direction of the molded case 18, a resin layer having the upper surface that is higher than the surface (sensor surface) of the solid-state image sensing element 20 may be provided between the interior wall of the molded case 18 and the solid-state image sensing element 20. This allows reducing failure in the imaging due to a disturbance of ambient light.

It is apparent that the present invention is not limited to the above embodiment, and may be modified and changed without departing from the scope and spirit of the invention.

What is claimed is:

1. A solid-state imaging device, comprising:
an elongated substrate;
a metallic layer exposed to a surface of said substrate and extending in an elongating direction of the substrate; and
an elongated solid-state image sensing element mounted over said metallic layer,
wherein a thickness in a region of said metallic layer right under and in adherence with an amplifier unit of said solid-state image sensing element is larger than thicknesses in other regions of said metallic layer,
at least one protruding portion on the surface of said metallic layer in other regions except said region right under the amplifier unit,
wherein said solid-state image sensing element is partially mounted over said metallic layer in said region right under said amplifier unit and is also partially mounted over said protruding portion in other regions, so that said solid-state image sensing element is substantially horizontally maintained.

2. The solid-state imaging device as set forth in claim 1, wherein said metallic layer is composed of a first metallic layer and a second metallic layer,
wherein the region of said metallic layer right under the amplifier unit of said solid-state image sensing element is composed of said first metallic layer and said second metallic layer disposed on a lower surface of the first the metallic layer, and
wherein the other regions of said metallic layer are composed of said first metallic layer.

3. The solid-state imaging device as set forth in claim 2, wherein said second metallic layer contains one or more metal(s) selected from a group consisting of copper, aluminum and an alloy thereof.

4. The solid-state imaging device as set forth in claim 2, wherein a thermal resistance of said solid-state imaging device is equal to or lower than 35 degree C./W, and a thickness of said second metallic layer is equal to or larger than 1 mm.

5. A solid-state imaging device, comprising:
an elongated substrate;
a metallic layer exposed to a surface of said substrate and extending in an elongating direction of the substrate;
an elongated solid-state image sensing element mounted over said metallic layer; and
at least one protruding portion on the surface of said metallic layer in other regions except said region right under an amplifier unit,
wherein a thickness in a region of said metallic layer right under said amplifier unit of said solid-state image sensing element is larger than thicknesses in other regions of said metallic layer, and wherein said solid-state image sensing element is partially mounted over said metallic layer in said region right under said amplifier unit and is also partially mounted over said protruding portion in other regions, so that said solid-state image sensing element is substantially horizontally maintained.

6. A solid-state imaging device, comprising:

an elongated substrate;

a first metallic layer exposed to a surface of said substrate and extending along and within a bounds of an elongating direction of the substrate;

an elongated solid-state image sensing element mounted over said first metallic layer;

a second metallic layer adhered firmly to a lower surface of said first metallic layer by an alloy including gold and tin so that said second metallic layer being located right under an amplifier unit of said solid-state image sensing element; and at least one protruding portion on the surface of said first metallic layer in other regions except said region right under the amplifier unit, wherein a thickness in a region of said metallic layer right under said amplifier unit of said solid-state image sensing element is larger than thicknesses in other regions of said metallic layer, wherein said solid-state image sensing element is partially mounted over said first metallic layer in said region right under said amplifier unit and is also partially mounted over said protruding portion in other regions, so that said solid-state image sensing element is substantially horizontally maintained.

7. The solid-state imaging device as set forth in claim 6, wherein said first metallic layer is plated with gold and said second metallic layer is plated with tin.

8. The solid-state imaging device as set forth in claim 7, wherein said second metallic layer contains one or more metal(s) selected from a group consisting of copper, aluminum and an alloy thereof.

9. The solid-state imaging device as set forth in claim 7, wherein a thermal resistance of said solid-state imaging device is equal to or lower than 35 degree C./W, and a thickness of said second metallic layer is equal to or larger than 1 mm.

\* \* \* \* \*